US008422552B2

(12) United States Patent
 Au et al.

(10) Patent No.: US 8,422,552 B2
(45) Date of Patent: Apr. 16, 2013

(54) ENTROPY CODING FOR VIDEO PROCESSING APPLICATIONS

(76) Inventors: James Au, Richmond (CA); Stephen Farley, Newmarket (CA); Kenn Heinrich, Oshawa (CA)

( * ) Notice: Subject to any disclaimer, the term of this patent is extended or adjusted under 35 U.S.C. 154(b) by 1457 days.

(21) Appl. No.: 11/693,567

(22) Filed: Mar. 29, 2007

(65) Prior Publication Data

US 2008/0240233 A1  Oct. 2, 2008

(51) Int. Cl.
  *H04N 11/02* (2006.01)
(52) U.S. Cl.
  USPC .................................................. 375/240.02
(58) Field of Classification Search ........................ None
  See application file for complete search history.

(56) References Cited

U.S. PATENT DOCUMENTS

| | | | |
|---|---|---|---|
| 5,142,576 | A | 8/1992 | Nadan |
| 5,416,529 | A | 5/1995 | Lake |
| 5,557,332 | A | 9/1996 | Koyanagi et al. |
| 5,663,724 | A | 9/1997 | Westby |
| 5,691,768 | A | 11/1997 | Civanlar et al. |
| 5,847,771 | A | 12/1998 | Cloutier et al. |
| 5,875,305 | A | 2/1999 | Winter et al. |
| 6,285,408 | B1 | 9/2001 | Choi et al. |
| 6,369,855 | B1 | 4/2002 | Chauvel et al. |
| 6,628,702 | B1 | 9/2003 | Rowitch et al. |
| 6,887,590 | B2 | 5/2005 | Zeizinger et al. |
| 7,409,056 | B2 | 8/2008 | LeBlanc et al. |
| 7,436,903 | B2 | 10/2008 | Sandhu et al. |
| 7,843,998 | B2 | 11/2010 | Bjontegaard |
| 7,953,284 | B2 | 5/2011 | Au et al. |
| 8,369,411 | B2 | 2/2013 | Au et al. |
| 2002/0015092 | A1 | 2/2002 | Feder et al. |
| 2002/0021234 | A1* | 2/2002 | Yanagiya et al. ............. 341/107 |
| 2002/0196853 | A1 | 12/2002 | Liang et al. |
| 2003/0138045 | A1 | 7/2003 | Murdock et al. |
| 2005/0094729 | A1 | 5/2005 | Yuan et al. |
| 2005/0196051 | A1 | 9/2005 | Wong et al. |
| 2006/0088099 | A1 | 4/2006 | Gao et al. |
| 2006/0126726 | A1 | 6/2006 | Lin et al. |

(Continued)

FOREIGN PATENT DOCUMENTS

| EP | 1 296 520 | 3/2003 |
|---|---|---|
| EP | 1 355 499 A2 | 10/2003 |

(Continued)

OTHER PUBLICATIONS

European Office Action dated Dec. 17, 2010 cited in Application No. 08 732 886.0.

(Continued)

*Primary Examiner* — David Pearson
(74) *Attorney, Agent, or Firm* — Merchant & Gould

(57) ABSTRACT

An entropy coding apparatus. In a specific embodiment, the entropy coding apparatus includes a renormalization process and an encode-decision process that communicates with the renormalization process. The encode-decision process is adapted to run in parallel with the renormalization process without the renormalization process being nested therein. In a more specific embodiment, the entropy coding apparatus includes an entropy encoder that is H.264 compliant. The encode-decision process includes a first mechanism for pre-computing certain parameters to eliminate the need to nest the renormalization process within the encode-decision process. The renormalization process and the encode-decision process are components of a Context Adaptive Binary Arithmetic Coding (CABAC) module.

29 Claims, 8 Drawing Sheets

U.S. PATENT DOCUMENTS

| | | | |
|---|---|---|---|
| 2006/0294174 A1* | 12/2006 | Haque et al. | 708/490 |
| 2008/0056350 A1 | 3/2008 | Lyashevsky et al. | |
| 2008/0075376 A1* | 3/2008 | Wilson et al. | 382/247 |
| 2008/0117965 A1 | 5/2008 | Vysotsky et al. | |
| 2008/0162911 A1* | 7/2008 | Vaithianathan | 712/300 |
| 2008/0240228 A1 | 10/2008 | Heinrich et al. | |
| 2008/0240253 A1 | 10/2008 | Au et al. | |
| 2008/0240254 A1 | 10/2008 | Au et al. | |
| 2008/0240587 A1 | 10/2008 | Au et al. | |
| 2008/0291940 A1 | 11/2008 | LeBlanc et al. | |

FOREIGN PATENT DOCUMENTS

| | | |
|---|---|---|
| WO | WO 01/52538 | 7/2001 |
| WO | WO 2008/039321 | 4/2008 |
| WO | WO 2008/121662 A2 | 10/2008 |
| WO | WO 2008/121663 A2 | 10/2008 |
| WO | WO 2008/121664 A2 | 10/2008 |
| WO | WO 2008/121664 A3 | 10/2008 |
| WO | WO 2008/121667 A2 | 10/2008 |
| WO | WO 2008/121667 A3 | 10/2008 |
| WO | WO 2008/127855 A1 | 10/2008 |

OTHER PUBLICATIONS

Mo Li, et al, "A High Throughput Binary Arithmetic Coding Engine for H.264/AVC", 6 pages, Solid-State and Integrated Circuit Technology, 2006.

Shojania H., et al., "A VLSI Architecture for High Performance CABAC Encoding", 4 pages, Visual Encoding and Image Processing, 2005.

Shojania H., et al., "A High Performance CABAC Encoder", 12 pages, IEEE-NEWCAS Conference, 2005.

Hendrick Eeckhaut, et al., "Optimizing the Critical Loop in the H.264/AVC CABAC Decoder", 6 pages, Field Programmable Technology, 2006.

Lingfeng Li, et al., "A CABAC Encoding Core with Dynamic Pipeline for H.264/AVC Main Profile", 4 pages, Circuits and Systems, 2006.

Marpe D., et al., "Context-Based Adaptive Binary Arithmetic Coding in the H.264/AVC Video Compression Standard", 18 pages, IEEE Transactions on Circuits and Systems for Video Technology, 2003.

Ron Wilson, "The Right Video Architecture Can Make All the Difference," Acquired at: http://www.edn.com/contents/images/6363920,pdf, Sep. 1, 2006, 9 pgs.

Wonjae Lee et al., "Pipelined Intra Prediction Using Shuffled Encoding Order for H.264/AVC," Tencon, 2006, IEEE Region Conference, 4 pgs.

Kazushi Sato et al., "Consideration on Intra Prediction for Pipeline Processing in H.264/MPEG-4 AVC," Applications of Digital Image Processing XXVII, Proceedings of SPIE, vol. 5558, 2004, pp. 485-494

Yu-Wen Huang et al., "Hardware Architecture Design for H.264/AVC Intra Frame Coder," Circuits and Systems, 2004, pp. 269-272.

Jian-Wen Chen et al., "Introduction to H.264 Advanced Video Coding," Design Automation, Asia and South Pacific Conference on Jan. 24, 2006, pp. 736-741.

International Search Report dated Dec. 3, 2008 cited in Application No. PCT/US2008/058349.

International Search Report dated Nov. 10, 2008 cited in Application No. PCT/US2008/058335.

International Search Report dated Nov. 14, 2008 cited in Application No. PCT/US2008/058334.

International Preliminary Report dated Sep. 29, 2009 cited in Application No. PCT/US2008/058334.

European Office Action dated Feb. 11, 2010 cited in Application No. 08 732 886.0.

European Office Action dated Feb. 25, 2010 cited in Application No. 08 780 490.2.

European Office Action dated Mar. 18, 2010 cited in Application No. 08 744 419.6.

European Office Action dated Mar. 18, 2010 cited in Application No. 08 732 889.4.

U.S. Office Action dated Jul. 23, 2010 cited in U.S. Appl. No. 11/693,439.

U.S. Final Office Action dated Oct. 18, 2010 U.S. Appl. No. 11/693,439.

European Office Action dated Nov. 3, 2011 Application No. 08 732 886.0, 6 pgs.

Canadian Office Action dated Jul. 4, 2011 Application No. 2,682,590.

U.S. Office Action dated Jun. 16, 2011 U.S. Appl. No. 11/693,526.

U.S. Office Action dated Jun. 16, 2011 U.S. Appl. No. 11/693,473.

Genhua Jin et al., "A Parallel and Pipelined Execution of H.264/AVC Intra Prediction," Proceedings of the Sixth IEEE International Conference on Computer and Information Technology, 2006, 6 pgs.

U.S. Office Action dated Jun. 27, 2011 U.S. Appl. No. 11/693,506.

Canadian Office Action dated Jan. 5, 2012 Application No. 2,682,461, 3 pgs.

Canadian Office Action dated Jan. 11, 2012 Application No. 2,682,449, 3 pgs.

U.S. Final Office Action dated Dec. 14, 2011 U.S. Appl. No. 11/693,473, 25 pgs.

U.S. Final Office Action dated Dec. 16, 2011 U.S. Appl. No. 11/693,526, 21 pgs.

U.S. Final Office Action dated Jan. 4, 2012 U.S. Appl. No. 11/693,506, 19 pgs.

Canadian Office Action dated Mar. 26, 2012 Application No. 2,682,436, 2 pgs.

Canadian Office Action dated May 7, 2012 Application No. 2,682,315, 3 pgs.

European Office Action dated May 29, 2012 Application No. 08 732 886.0, 7 pgs.

Canadian Office Action dated Jun. 4, 2012 Application No. 2,682,590, 2 pgs.

Canadian Office Action dated Jun. 21, 2012 Application No. 2,682,461, 4 pgs.

European Office Action dated Feb. 13, 2013 cited in Application No. 08 780 490.2-1908, 5 pgs.

European Office Action dated Feb. 25, 2013 cited in Application No. 08 744 419.6-1908, 4 pgs.

* cited by examiner

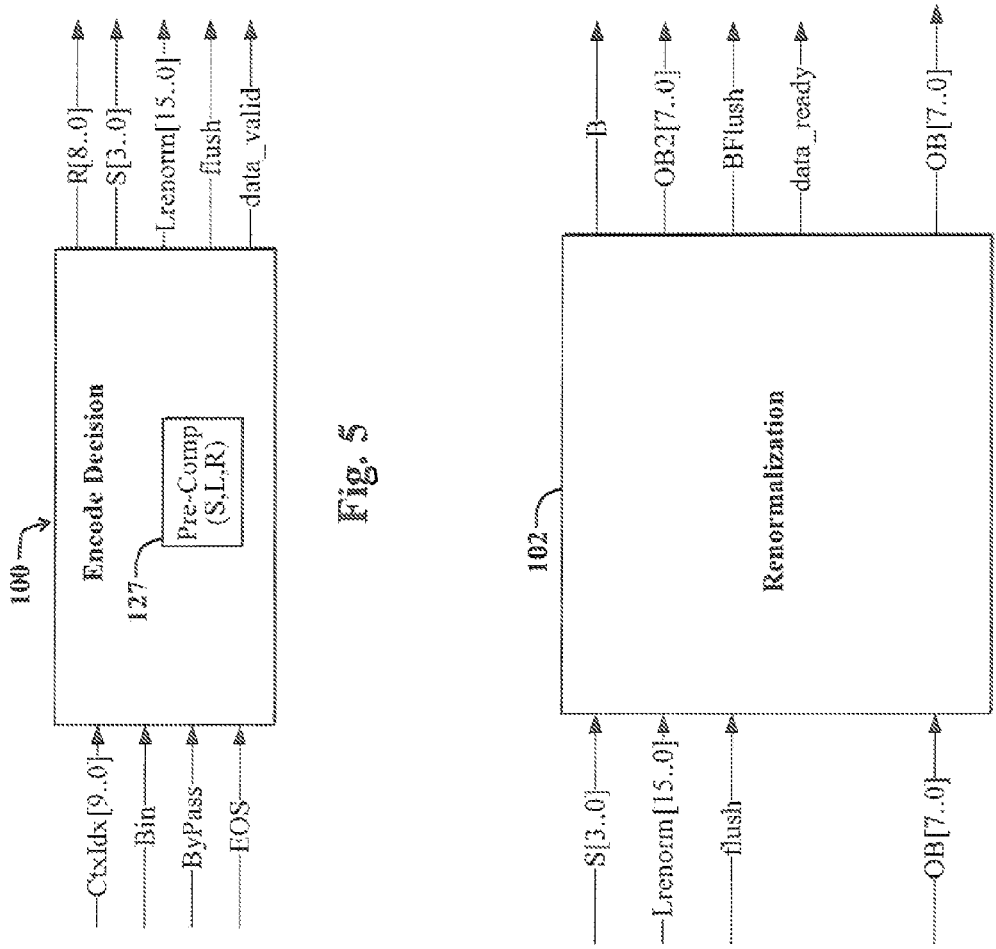

ENTROPY CODING FOR VIDEO PROCESSING APPLICATIONS

BACKGROUND OF THE INVENTION

This disclosure relates generally to video processing and more specifically relates to entropy coding of video data. Video processing systems are employed in various demanding applications, including high-definition television, missile guidance systems, and internet video streaming. Such applications often demand compact cost-effective systems for encoding, transmitting, and decoding high quality compressed video relatively accurately, quickly, and efficiently.

Efficient video processing systems are particularly important in so-called H.264 applications, where video processing systems are subjected to strict standards. H.264 is digital video codec standard written by the Joint Video Team (JVT) comprising the International Telecommunication Union (ITU)—Telecommunication Standardization Sector (T) and the International Organization for Standardization (ISO)/International Electrotechnical Commission (IEC) Moving Picture Experts Group (MPEG). The H.264 standard is also called the ISO/IEC MPEG-4 Part 10 standard or the ITU-T H.264 standard.

In an example H.264 system, pixels of a video image are logically grouped into 16×16 blocks of pixels called macroblocks. The image is partitioned into horizontal bands, called slices, each containing several macroblocks. Conventionally, a video frames must be partitioned into multiple slices, and sub-optimal motion search methods must be used due to relatively inefficient video processing methods and hardware speed constraints. For example, H.264 standards specify use of certain nested loops to perform Context. Adaptive Binary Arithmetic Coding (CABAC) entropy coding in an H.264 encoder, which can result in relatively inefficient serial processing operations.

BRIEF DESCRIPTION OF THE DRAWINGS

FIG. 5 is a diagram illustrating example inputs and outputs of an encode-decision module of the encode-bin module of FIG. 4.

FIG. 6 is a diagram illustrating example inputs and outputs of a renormalization module of the encode-bin module of FIG. 4.

DETAILED DESCRIPTION OF EXAMPLE EMBODIMENTS

Figure 1:
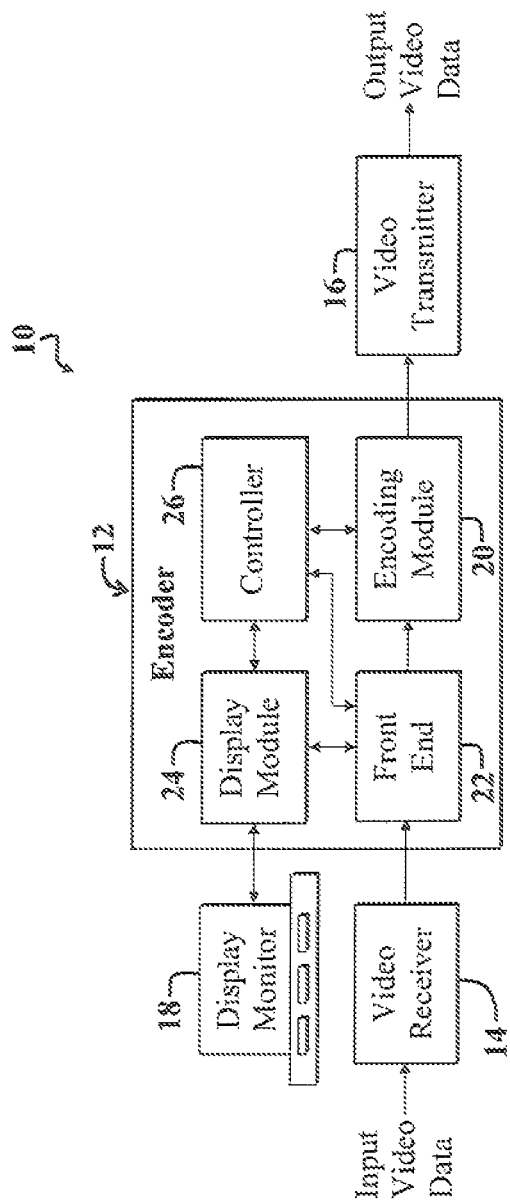
FIG. 1 illustrates an example video-encoding system.

For the purposes of the present discussion, a macroblock may be any grouping of pixels in a frame of data. A frame may be any set of data that includes plural pixels of information, where a pixel may be a value associated with a data point. An image frame may be any collection of data points or pixels that are associated with an image or something to be displayed or viewed. An image may be any thing or representation of a thing that can be viewed. A slice of an image frame may be any grouping of macroblocks for processing purposes.

An example of a macroblock is the macroblock discussed, in the H.264 standard, which, includes a 16×16 group of pixels. An example of documentation that provides details of the H.264 standard is ISO/IEC 14496-10 (ITU-T H.264), International Standard (2005), Advanced video coding for generic audiovisual services; which is hereby incorporated by reference as if set forth in full in this specification for all purposes. For the purposes of generating a prediction frame, macro-blocks within a slice are predicted based on previously predicted macroblocks so that values associated with one macroblock within the slice depend on values associated with one or more other macroblocks within the slice.

An example embodiment of an entropy coding module includes a renormalization process and an encode-decision process that communicates with the renormalization process. The encode-decision process is adapted to run in parallel with the renormalization process without the renormalization process being nested therein. For the purposes of the present discussion, an entropy coding module may be any module that employs one or more statistics or probability values to facilitate encoding data.

In a more specific embodiment, the entropy coding module includes an entropy encoder that is H.264 compliant. The encode-decision process includes a first mechanism for pre-computing certain parameters to eliminate nesting of the renormalization process within the encode-decision process that otherwise occurs in an H.264 Context, Adaptive Binary Arithmetic Coding (CABAC) entropy encoding module. The renormalization process and the encode-decision process are components of a CABAC module. Parallel processing in a CABAC encoding module is enabled by eliminating nesting requirements that result in nested processing loops and relatively inefficient and slow serial processes.

The CABAC module of the present example embodiment is included, within a video encoder. The certain parameters include an interval offset, value (L) and an interval range value (R) as defined in one or more H.264 standards and further include a parameter (S) that is adapted to specify a number of cycles or duration for which the renormalization process should run before receiving additional data from the encode-decision process.

For the purposes of the present discussion, a CABAC module may be any module that is adapted to employ arithmetic coding of data in a signal to facilitate entropy coding. Arithmetic coding may be any method capable of assigning a number to a portion of a signal, such as a message in the signal. In an example entropy coding scheme, lengths of numbers or codes used to encode a portion of a signal are affected, by the probability of occurrence of the portion within the signal. In an example entropy encoder, commonly used symbols in a given data stream, i.e., signal, are encoded with the shorter codewords than, less commonly used symbols.

Use of this embodiment or other embodiments disclosed herein or may facilitate implementing an encoder capable of encoding single-slice video frames, wherein one slice is employed for each video frame. This may greatly improve video quality. Note however, that the certain embodiments disclosed herein may also be used in multiple slice implementations without departing from the scope of the present teachings.

The term, "coding" may refer to any encoding or decoding process. While certain embodiments are discussed herein with respect to an encoder, those skilled in the art may readily adapt certain embodiments herein to a decoder without departing from the scope of the present teachings and without undue experimentation.

In the present embodiment, an entire image frame is treated as a single slice, thereby yielding improved video output quality. The encode-bin module may be implemented via a first pipelined process. The encode-decision process may be implemented via a second pipelined process. For the purposes of the present discussion, a pipelined processor or process may be any processor or process that may begin processing a second portion of information without waiting for the completion of processing of a previously input first portion of information. An example pipelined processor performs certain operations back-to-back so that during a certain portion of the processing, both operations are operating simultaneously, i.e., in parallel.

Hence, unlike a conventional H.264 CABAC module, which must implement certain functions, such as an encode-decision and a renormalization function, in a serial fashion, certain interdependencies between functions created by nested loops or recursive processes are removed in certain embodiments disclosed here. Accordingly, certain embodiments disclosed herein may process corresponding functions in parallel, such as via one or more pipelined processes. This may result in improved CABAC speed and performance, which may enable use of single-slice video frames, which may further increase video quality. The improved CABAC speed facilitates real-time bit production feedback to rate control to further improve video quality.

In summary, certain embodiments disclosed herein employ novel techniques to facilitate parallel processing in a CABAC module, which helps to enable single-slice per picture H.264 encoding for high definition pictures and facilitates more sophisticated rate control methods.

For clarity, various well-known components, such as power supplies, H.264 decoders, computer systems, daughter cards, audio encoders, hosts, user interfaces, scaling circuits, timing clocks, and so on, have been omitted from the figures. However, those skilled in the art with access to the present teachings will know which components to implement and how to implement them to meet the needs of a given application.

FIG. 1 illustrates an example video-encoding system 10. The encoding system 10 includes an encoder 12, which receives video input from a video receiver 14 and provides resulting compressed video to a video transmitter 16, For illustrative purposes, the encoder 12 is shown communicating with a display 18 for displaying video frames.

The encoder 12 includes an encoding module 20, a front end 22, a display module 24, and a controller 26. The front end 22 communicates with the video receiver 14, the encoding module, the display module 24, and the controller 26. The encoding module 20 further communicates with the controller 26. The display module 24 further communicates with the controller 26 aid the display monitor 18.

In operation, the front end 22 formats input from the video receiver 14, which is accessible by the display module 24 and the encoding module 20. The controller 26 provides control input to the display module, the front end 22, and the encoding module 20 to facilitate controlling the operation of the encoder. Input video may be displayed via the display monitor 18 after the video data is formatted and prepared as needed via the display module 24.

In the present example embodiment, the encoding module 20 compresses input video in accordance with one or more H.264 standards and via a pipelined or parallel processing scheme, as discussed more folly below. Example processing functions implemented via the encoding module 20 include inter prediction, intra prediction, exhaustive motion search, frequency transforms, quantization, dequantization, frame subtraction and addition, and entropy coding for video image frames. The encoding module 20 outputs resulting compressed video to the video transmitter 16. The video transmitter 16 may then transmit the resulting video to a decoder, to memory, and so on, as needed for a particular application.

The encoding module 20 may be implemented to perform processing in accordance with the H.264 standard. The front end 22, display module 24, and controller 26 may be implemented via various technologies, including, but not limited to Field Programmable Gate Array (FPGA) and Digital Signal Processor (DSP) technologies.

Figure 2:
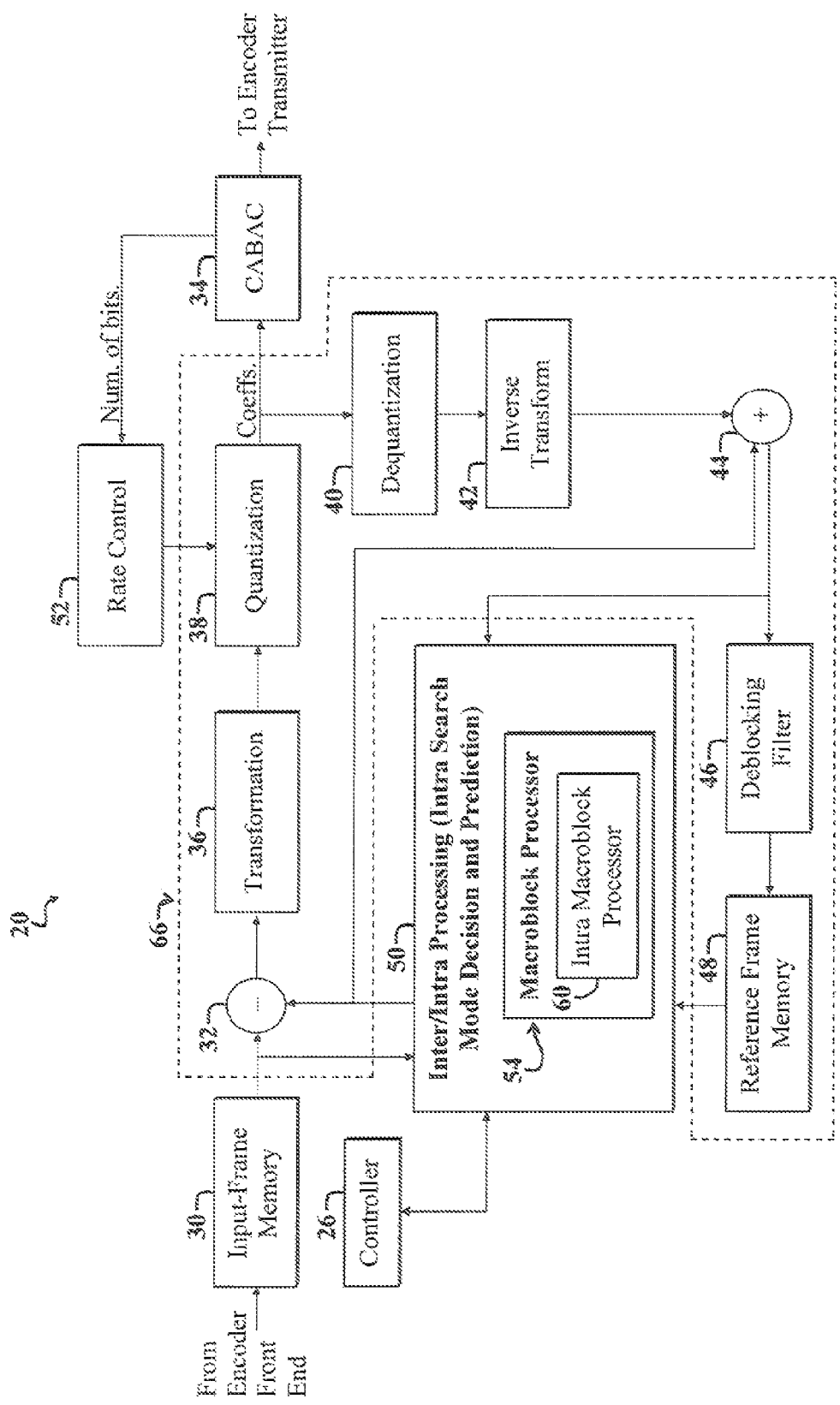
FIG. 2 is a more detailed diagram illustrating example components of the encoding module included in the video-encoding system of FIG. 1.

FIG. 2 is a more detailed diagram illustrating example components 30-52 of the encoding module 20 included in the video-encoding system 10 of FIG. 1. The encoding module 20 includes an input-frame memory 30 for receiving and selectively storing video frames from the front end 22 of FIG. 1. The output of the input-frame memory 30 is input to a subtracter 32 and to an inter/intra processing module 50. The subtracter 32 also receives input from the inter/intra processing module 50 and provides output to a transformation module 36. An output of the transformation module 36 is coupled to a quantization module 38, also called a quantizer, an output of which is coupled to inputs of a dequantization module 40 and a entropy encoder 34. In the present example embodiment, the entropy encoder 34 implements Context Adaptive Binary Arithmetic Coding (CABAC), and consequently, is also called a CABAC module. The CABAC module 34 provides feedback to a rate control module 52, which provides a rate-control signal to the quantizer 38.

The dequantizer 40 is further coupled to an inverse transform module 42, an output of which is coupled to an input of an adder 44. An output of the adder 44 is coupled to an input of a deblocking filter 46. An output of the deblocking filter 46 is coupled to an input of a reference frame memory 48. An output, of the reference frame memory 48 is coupled to an input of the inter/intra processing module 50. An output of the inter/infra processing module 50 is coupled to an input of the subtracter 32 and to an input of the adder 44.

In operation, an input frame from the input-frame memory 30 is provided to the inter/intra processing module 50 and to the subtracter 32. The frame is processed by the encoding module 20 in units of macroblocks. Each macroblock is encoded so-called inter mode or intra mode. In inter mode, the inter/intra processing module 50 executes one or more instructions to facilitate, forming a prediction frame based on a previously reconstructed and filtered frame, called a reference frame, which is provided to the inter/intra processing module 50 by the reference frame memory 48. The inter/intra processing module 50 may also implement inter/intra search and mode-decision functions. Details of inter/intra search and mode-decision operations that are known in the art may be readily adapted for use with example embodiments by those skilled in the art, without undue experimentation.

Reference frames used for inter prediction have been filtered by the deblocking filter 46. The inter/intra processing module 50 employs a first feedback loop formed by the inter/intra processing module 50, the subtracter 32, the transformation module 36, the quantization module 38, the dequantizer 40, the inverse transform module 42, the adder 44, the deblocking filter 46, and the reference frame memory 48 to facilitate generating a motion-compensated predicted frame from one or more reference frames.

In intra mode, the inter/intra processing module 50 executes one or more instructions to facilitate forming a prediction frame based on the current frame, as opposed to a reference frame. In intra mode, the inter/intra processing module 50 employs a second feedback loop that includes the inter/intra processing module 50, the subtracter 32, the transformation module 36, the quantizer 38, the dequantizer 40, the inverse transform 42, and the adder 44 to facilitate computing a reconstructed prediction frame.

In either mode, a predicted macroblock output by the inter/intra processing module 50 is subtracted from the corresponding macroblock in the input frame that is output from the input-frame memory 30. The resulting macroblock is called a residual or difference macroblock. The difference macroblock is then transformed from a time domain to a frequency domain, such as via a block transform, by the transformation module 36. The resulting transformed macroblock is quantized by the quantizer 38; dequantized by the dequantizer 40; and then transformed back to the time domain via the inverse transform module 42. The resulting residual macroblock is added to a corresponding macroblock from the prediction frame that is output from the inter/intra processing module 50 before the resulting added macroblock, called a reconstructed macroblock, is input back to the inter/intra processing module 50 as a reconstructed macroblock.

The output of the quantizer 38 represents a set of quantized transform coefficients. These coefficients are then, entropy encoded via the CABAC 34. Entropy encoded coefficients and information required to decode a macroblock, such as prediction mode, quantizer step size, motion vector information, motion-compensation information, and so on, are output from the CABAC 34 via one or more bitstreams. The number of bits employed by the CABAC during a given, operation may be fed back to the rate control module 52 to facilitate controlling the rate of the quantizer 38.

Hence, the rate control module 52 generates rate control signals to control the quantizer 38 and accompanying quantization parameters based on bit-production feedback from a previous Macroblocks, picture complexity, current bit buffer levels. The inter/intra processing module 50 may facilitate performing prediction through motion search and intra search mode-decision operations; may implement a mode decision function that selects a best prediction mode for each macroblock to be processed; and may perform prediction via motion compensation or intra compensation to form sample intensity predictions. The terms intra compensation and intra prediction may be employed interchangeably herein. Intra compensation involves predicting a macroblock based on information from the current frame in which the macroblock is a part.

The subtracter 32 outputs residuals representing differences between input data samples from the input-frame memory 30 and prediction samples from the inter/intra processing module 50. The transform module 36 converts residuals to the frequency domain. The quantizer 38 quantizes frequency coefficients, effectively discarding certain information to reduce entropy in the residuals. The dequantizer 40 and inverse transform module 42 are adapted to reconstruct transformed, and quantized residuals through dequantization and inverse transform processes. The adder 44 facilitates adding reconstructed residuals output from the inverse transform module 42 to prediction samples output from the inter/intra processing module 50 to reconstruct decoded samples for a given macroblock. The deblocking filter 46 is adapted to remove blocking artifacts from decoded samples output from, the adder 44. The CABAC 34 is adapted to implement entropy coding in accordance with H.264 main/high profile. The CABAC 34 codes macroblock modes, prediction information, and residuals into H.264-compliant bitstreams.

For illustrative purposes, the controller 26 is shown communicating with the inter/intra processing module 50. The controller 26 may communicate with more modules, different modules, or no modules in FIG. 2 without departing from the scope of the present teachings. Furthermore, the rate-control module 52 and the controller 26 may be implemented in a common control module without departing from the scope of the present teachings.

Example embodiments discussed more fully below pertain primarily to intra prediction mode and corresponding components within the inter/intra processing module 50 for implementing intra prediction mode, which may include facilitating performing intra prediction and implementing an exhaustive motion search, wherein one or more motion search vectors are computed for each macroblock.

For the purposes of the present discussion, a motion search vector may be any value or set of values that contain information pertaining to the movement or projected movement of information or values in an image frame.

Figure 3:
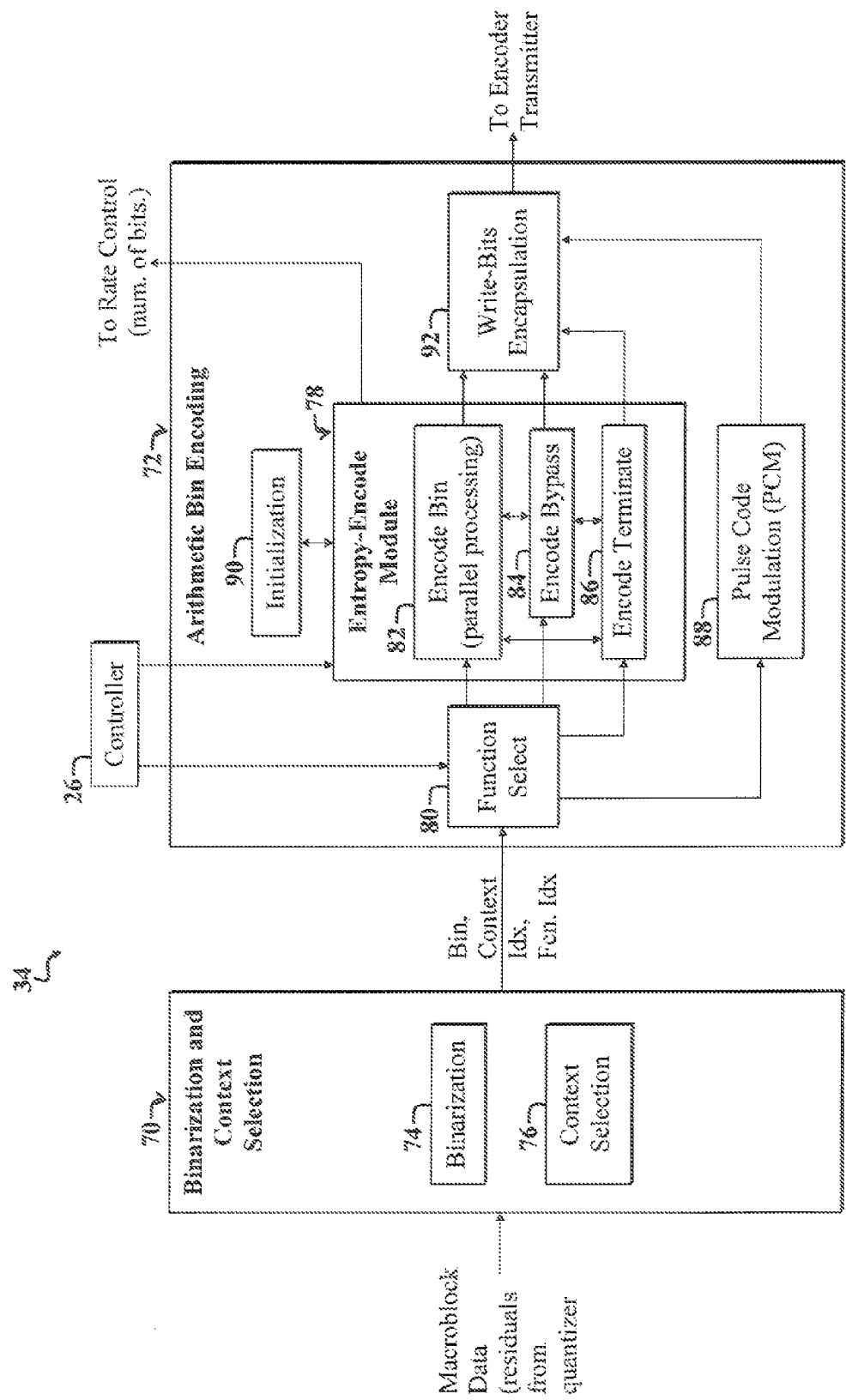
FIG. 3 is a more detailed diagram illustrating example components of the Context Adaptive Binary Arithmetic Coding (CABAC) module of FIG. 2.

FIG. 3 is a more detailed diagram illustrating example components of the Context Adaptive Binary Arithmetic Coding (CABAC) module 34 of FIG. 2. The CABAC module 34 includes an initial binarization/context-selection module 70, which includes a binarization module 74 and a context-selection module 76. An output of the binarization/context-selection module 70 is coupled to an input of an arithmetic bin-encoding module 72.

The arithmetic bin-encoding module 72 includes a function-selection module 80, which is coupled to an encode-bin process module 78, a Pulse Code Modulation (PCM) module, and an initialization module 90. The encode-bin process module 78 further includes an encode-bin module 82, an encode-bypass module 84, and an encode-terminate module 86, which are also coupled to the function-selection module 80. Outputs of the encode-bin module 82, the encode-bypass module 84, the encode-terminate module 86, and the PCM module 88 provide input to a write-bits encapsulation module 92, which outputs an encoded bitstream from the arithmetic bin-encoding module 72.

In the present example embodiment, the initialization module 90 communicates with the entropy-encode module 78 and accompanying encode-bin module 82. The encode-bin module 82 is implemented via a pipelined processor that facilitates parallel processing of various functions internal to the encode-bin module 82, as discussed more fully below. For illustrative purposes, the controller 26 is coupled to the entropy-encode module 78 and the function-select module 80. Note however, that the function-select module 80 may operate without control input from the controller 26 without departing from the scope of the present teachings.

In operation, the binarization/context-selection module 70 receives an input data stream representing macroblock data, such as residuals, i.e., coefficients, motion vectors, reference index, delta Quantization Parameter (QP), Coded Block Pattern (CBP) information, and so on, from the quantization module 38 of FIG. 2.

For the purposes of the present discussion, macroblock data may be any information pertaining to a macroblock of a frame. The binarization module 74 maps incoming macroblock data into a binary sequence of 1's and 0's or other binary representations and outputs bins associated with a context identification, also called a context index. Hence, the binarization module 74 converts incoming modes and residual coefficients and prediction mode data into a string of zeros and ones. The binarization module 74 employs logic and memory modules to process different syntax elements and corresponding context templates.

The context-selection, module 76 determines a context for certain input data and selects a probability model based on each context. The input macroblock data further includes syntax elements, which specify macroblock type, motion-vector data, texture data, and so on. The context-selection module 76 employs an adaptive coding to estimate a Probability Density Function (PDF) for each syntax element. The binarization/context-selection module 70 subsequently outputs data, including bin, context identification, called a context index (context idx), and function identification information, called a function index (function idx).

The context-selection module 76 further determines an appropriate context index and function index for each encoded bin. Hence, each, bin is associated, with a context index and a function index. The function index, facilitates routing of each bin in the arithmetic bin-encoding module 72 by the function-selection module 80 to the encode-decision module 82, the encode-bypass module 84, the encode-terminate module, the PCM module, and so on.

The bin and the context index information are employed inside various functions within the arithmetic bin-encoding module 72 to facilitate encoding operations. The binarization module 74 and the context-selection module 76 may be implemented in accordance with H.264 standards by those skilled in the art without undue experimentation.

The bin, context index, and function index are input from the binarization/context-selection module 70 to the function-selection module 80 of the arithmetic bin-encoding module 72. Additional values, such as bypass. End of Sequence (EOS), context flags (ctx flag), coding flags (coder_flag). Most Probable Sequence (MPS) information, and so on, may be output from the binarization/context-selection module to the arithmetic bin-encoding module 72.

The function-selection module 80 receives bin, context identification, and function identification from the binarization/context-selection module 70 and selectively activates one or more functions associated with the modules 82-90 of the arithmetic bin-encoding module 72 based on the received information.

The initialization module 90 is adapted to compute various initial values, such initial coder flags (init_coder_flag), initial interval offset values (init_L), initial interval range values (init_R), initial, context flags init_context_flag), initial probability information (init prob), and initial MPS information for use by the encode-bin module 82, as discussed more fully below. These parameters, such as init_context_flag, init_coder_flag, and so on, may be as defined in one or more H.264 standards.

For the purposes of the present discussion, an encode-decision module, such as the module 82, may be any module, hardware or software function, procedure, computer, or other set of instructions adapted to determine or update a context state pertaining to an input thereof. A context state may be any description of an input or other data describing a condition thereof. A module may be any module, hardware or software function, procedure, computer, or other set of instructions.

An encode-bypass module may be any module that is adapted to selectively skip encoding of different portions of an input via different probability values, or functions. In certain example embodiments disclosed herein, the encode-bypass module 84 is adapted to selectively adjust interval offset (L) and interval range (R) values when a bypass value is set to one (ByPass=1). An encode-terminate module may be any module that is adapted to selectively terminate an encoding process.

The write-bits encapsulation module 92 facilitates performing any remaining tasks, to format the output bitstream from the arithmetic bin-encoding module 72. The arithmetic bin-encoding module 72 incorporates requisite functionality for performing binary arithmetic bin encoding.

The entropy-encode module 78 takes each bin output from the binarization/context-selection module 70 and performs arithmetic encode (e.g., encode-decision, bin-encode, encode-bypass, and encode-terminate functions). The entropy-encode, module 78 is further adapted to implement context probability update, renormalization, and write-bits functions, as defined in H.264 standards. The entropy-encode module 78 may be implemented via relatively simple logic in hardware, such as via a Field Programmable Gate Array (FPGA) or Application Specific Integrated Circuit (ASIC).

The Pulse Code Modulation (PCM) module 88 may act as an escape mode that, prepares raw macroblock pixels for transmission instead of performing entropy encode operations. When the arithmetic bin-encoding module 72 operates in PCM mode, the CABAC 34 is flushed before raw pixel values are inserted into the output, bitstream.

Figure 4:
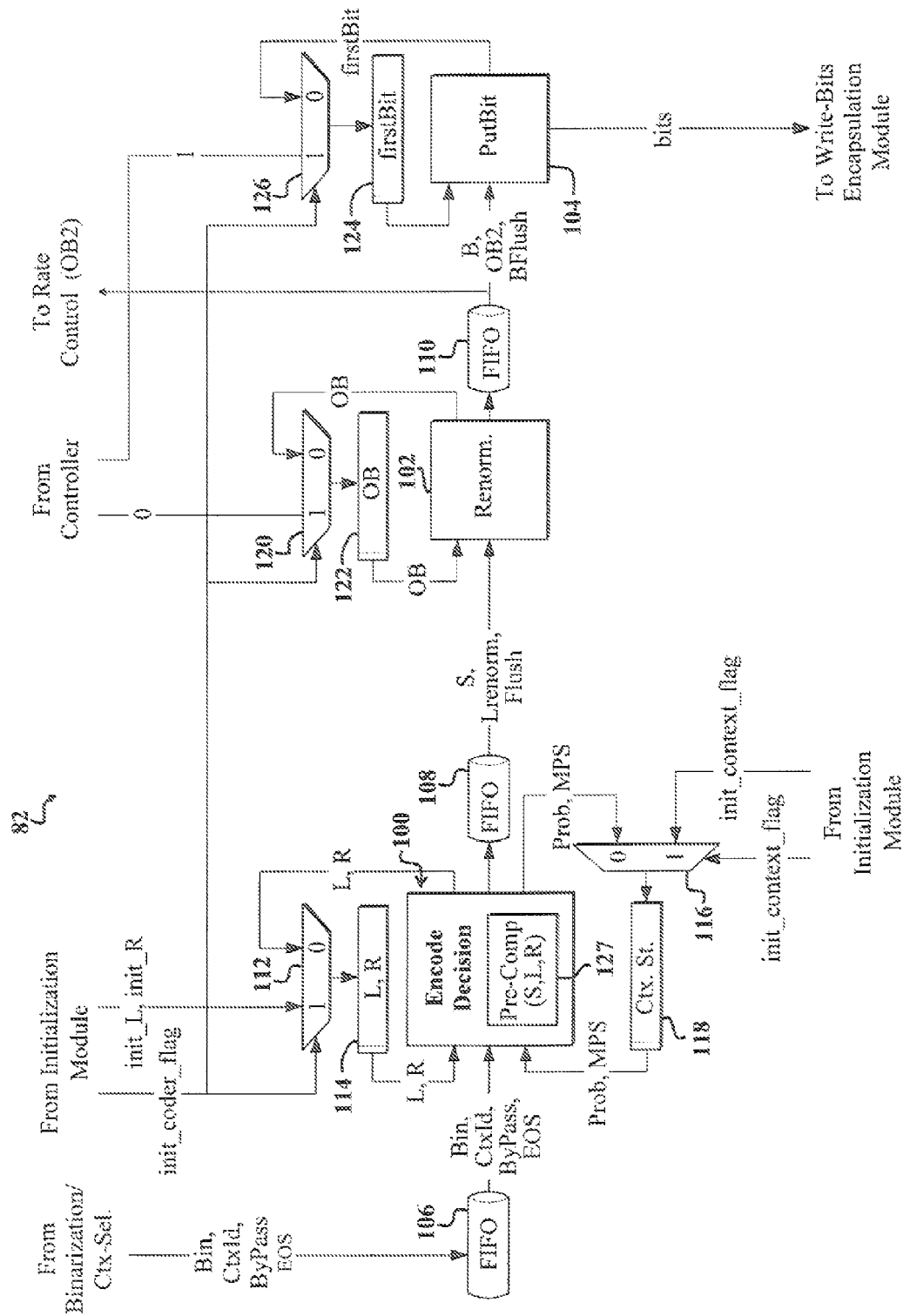
FIG. 4 is a more detailed diagram illustrating example components of the encode-bin module of the CABAC module of FIGS. 2 and 3.

FIG. 4 is a more detailed diagram illustrating example components of the encode-bin module 82 of the CABAC module 34 of FIGS. 2 and 3. The encode-bin module 82 includes an encode-decision module 100, a renormalization module 102, a PutBit module 104. A first buffer (First In First Out (FIFO) buffer) 106 is coupled between an input of the encode-bin module 82 and an input of the encode-decision module 100. The first FIFO 106 buffers input, such as bin, context index (ctxid), bypass flag (bypass), and End of Sequence (EOS) values, from the binarization/context-selection module 70 of FIG. 3, before the input is provided to the encode-decision module 100. A second buffer (FIFO) 108 is coupled between an output of the encode-decision module 100 and the renormalization module 102, A third FIFO is 110 is coupled between an output of the renormalization module 102 and an input of the PutBit module 104. The PutBit module 104 provides the output of the encode-bin module 82.

A first MUltipleXer (MUX) 112 receives an initial coder flag (init_coder_flag) from the initialization module 90 of FIG. 3 as a control input. Alternatively, init_coder_flag is provided to the encode-bin module 82 by the controller 26 of FIG. 3. The first MUX 112 receives an initial interval offset (L) and interval range (R) value as a first pair of inputs (init_L, init_R) and receives a second set of inputs comprising computed L and R values (L, R) output from the encode-decision module 100. The value of init_coder_flag input to the first MUX 112 controls whether the first pair of inputs (init_L, init_R) or the second pair of inputs (L, R) is output from the first MUX 112 to an L-R register 114. The L-R register 114 is coupled between an output of the first MUX 112 and an input of the encode-decision module 100.

A second MUX 116 receives an initial context flag (init_context_flag) as a control input. The second MUX 116 is adapted to selectively switch its output between a first group of inputs (etxid, init prob, MPS) and a second group of inputs (prob, MPS). The first, group of inputs includes an initial context index (etxid), an initial probability associated with a given bin (init_prob), and an initial Most Probable Sequence (MPS) value. The first group of inputs is obtained via the initialization module 90 of FIG. 3, or alternatively, the controller 26 of FIG. 3 provides one or more of the inputs. The second group of inputs includes a computed probability value (prob) and a computed MPS value output from the encode-decision module 100. A context-state register 118 buffers output of the second MUX 116, which is fed back to the encode-decision module 100.

A third. MUX 120 receives the init_coder_flag as a control input and selectively switches its output between zero (0) and an Outstanding Bits (OB) value output from the renormalization module 102, in accordance with the value of init_coder_flag. Output from the third MUX 120 is input to an OB register 122, an output of which fed back to the renormalization register 102. The OB register 122 implements a predetermined delay in the feedback between the third MUX 120 and the renormalization module 102.

A fourth MUX 126 receives the init_coder_flag as a control, input and selectively switches its output between one (1) and a first bit (firstBit) output from the PutBit module 104, in accordance with the value of the init_coder_flag. Output from the fourth MUX 126 is input to a first-bit register 124, an output of which is fed back to the renormalization register 104. The first-bit register 124 implements a predetermined delay in the feedback between the fourth MUX 126 and the PutBit module 104.

In operation, the CABAC encode-bin module 82 is implemented via a pipelined processor for facilitating implementing CABAC encoding via parallel processes. This is unlike a conventional CABAC encoder as defined in H.264 standards, which requires various serial processes, which are relatively slow, as discussed more fully below.

Representative parallel processes implemented via the CABAC encode-bin module 82 include processes implemented via the encode-decision module 100, the renormalization module 102, and the PutBit module 104. For the purposes of the present discussion, CABAC encoding may be any process that employs arithmetic coding to facilitate, entropy coding or vice versa.

Certain states of the CABAC encode-bin module 82 are characterized by the Current interval range (R) and the current offset value (L) in the current code interval. The value L is read from die register holding current L. The interval range (R) is subdivided in two regions, including a Least Probable Symbol (LPS) range and a Most Probable Symbol (MPS) range. The lengths of the ranges correspond to the probabilities associated with LPS and MPS, which are determined by the probability model used to encode the next symbol.

The encode-decision module 100 employs bin, context index (ctxid), bypass, EOS inputs, interval offset (L) and interval range (R), probability values, and MPS values to implement an arithmetic state machine and to perform probability updates. The encode-decision module 100 includes instructions for selectively updating L, R, probabilities (prob) and MPS values. L may be implemented as a fraction or floating point number, where R defines the length of an interval beginning at a position in a code, where the position is identified by L.

In the present embodiment, the encode-decision module 100 further includes a pre-computation module 127, which includes instructions for computing L, R, and an S parameter so that L and R feedback from the renormalization module 102 is not required. Hence, strategic use of the S parameter and pre-computation of S, L, and R facilitate removal of processing dependencies between various modules, 100, 102, 104 of the CABAC encode-bin module 82. This facilitates enabling the processes associated with the various modules 100, 102, 104 to run in parallel, such as in a pipelined fashion or via separate parallel-processing engines. For the purposes of the present discussion, a parallel process may be any process or execution of a set of instructions that includes the simultaneous or overlapping execution of two or more subprocesses or die simultaneous or overlapping execution of two or more subsets of instructions.

The renormalization module 102 implements instructions for updating the value of L associated with each bin being processed and further determines which bits (B) and Outstanding Bits (OBs) to output. For the purposes of the present discussion, a renormalization module may be any module capable of determining an output bit value based on a predetermined interval associated therewith. The interval may be a time interval, interval of a bit sequence, or other interval. Note that hi the present example embodiment, renormalization processes involving shifting bits of L and R are performed in the encode-decision module 100 instead of in the renormalization module 102, where such operations are conventionally implemented. Splitting such renormalization and selective shifting operations of L and R from the associated renormalization module facilitates removing dependencies between the renormalization module 102 and the encode-decision module 100. Removing the dependencies between me renormalization module 102 and the encode-decision module 100 facilitate implementing the CABAC encode-bin module 82 via a parallel process, such as via a pipelined processor. As shown in FIG. 4, various modules 100, 102, and 104 lack feedback between each other, and are implemented via corresponding processes running in a pipelined fashion in the present embodiment.

Separation of certain renormalization functions associated with L and R from the renormalization module 102 facilitates reducing the overall recursion path length of the CABAC encode-bin module 82. Furthermore, performing certain renormalization functions associated with L and R in the encode-decision module 100, facilitates storing a shift and a shifted-out portion of L in the encode-decision module 100 or the renormalization module 102, which facilitates removal of processing dependencies between the modules 100, 102, 104, which enables parallel processing. The shift portion of L corresponds to a portion, such as certain bits, of L that is added to L during a renormalization process involving shifting of a sequence of bits representing L. Similarly, a shifted-out portion of L corresponds to a portion of L that is removed from the sequence associated with L during renormalization.

By strategically moving and positioning logic and functionality of an H.264 CABAC encode-bin module into different positions in accordance with the present teachings, various computational efficiencies are achieved. Parallel processing may now be employed to run the modules 100, 102, 104 simultaneously. As another example, B and OB values used, by PutBit 104 may be stored and processed at a more desirable time during the PutBit process associated with the PutBit module 104.

The B values output from the renormalization module 102 instruct the PutBit module 104 to insert either a zero or one into the bitstream output from the PutBit module 104. OB acts as a counter to instruct the PutBit module 104 as to how many outstanding bits should be output for each execution of the PutBit process implemented via the PutBit module 104.

Hence, the PutBit module 104 determines which bits (bits) to output and how to output them, such as in what order, B and OB values output from the third FIFO 110, a first-bit parameter (firstbit), and a bFlush parameter (bFlush). For the purposes of the present discussion, a PutBit module may be any module adapted to provide an appropriate bit value as output based on bit value input to the PutBit module. In the present example embodiment, the PutBit module 104 may be further based on an OB parameter and an EOS or and end of process parameter associated with an end of a sequence, which may correspond to the end of a sequence of data comprising a given slice in a video frame.

In the present example embodiment, the renormalization module 102 calculates an additional outstanding-bits parameter (OB2) that is used by the PutBit module 104 to facilitate determining a number of bits to output for a given iteration of the PutBit module 104.

In a conventional CABAC encoder as defined, in H.264 standards, the associated renormalization module includes an internal nested loop that must be completed before L and R values are fed back to the renormalization module to the associated encode-decision module. The conventional encode-decision module must, wait for completion of the renormalization process to return L and R values to the encode-decision module. Hence, conventionally, the renormalization module acts as a nested loop within the encode-decision module, and the renormalization module itself has nested loops. Unfortunately, these nested loops have yielded inefficient serial processes, resulting in slow CABAC encoder.

In a conventional CABAC encoder, the associated encode-decision module is recursive on L and R, and the recursion path includes certain loops. The conventional encode-decision, renormalization, and PutBit modules each include loops for each input bin being processed. The resulting CABAC has a multi-level nested loop, wherein a given process depended upon the results of a sub-process, which depended upon the results of another sub-process, so that each process or sub-process had to be completed serially in a certain sequence. Unfortunately, such serial processing operations gave resulted in inefficient CABAC designs that are relatively slow. Such CABAC designs place design constraints on accompanying encoders, which inhibit single-slice video encoding and the associated high quality video output associated therewith. For the purposes of the present discussion, a loop may be any process or sub-process that is adapted to be repeated until a certain condition or state is met.

The S-parameter computed by the pre-computation module 127 is provided to the renormalization module 102 and specifies how many cycles or how long the renormalization module 102 should run before receiving additional information from the encode-decision module 100. Use of certain FIFO buffers, such as the second FIFO buffer 108 facilitates enabling the encode-decision module 100 to continue running while the renormalization module 102 continues running for a duration specified by S. Hence, strategic use of the S parameter and the FIFO buffer 108 facilitate enabling the encode-decision module 100 and the renormalization module 102 to operate in parallel, such, as in a pipelined fashion.

Conventionally, each process (encode-decision, renormalization, PutBit) of a CABAC encoder waits for the next process before starting the next iteration. Use of the FIFOs 106, 108, 110 in the present embodiment help to eliminate the need for one process to wait for the completion of another process.

Note that in a conventional renormalization process as defined by H.264 standards employs a recursive loop that renormalizes L and R by performing a cycle a certain number of times until a certain condition is met (e.g., R<0x100). Unfortunately, this loop is computationally costly and acts to inhibit parallel processing implementations. Instead of employing this so-called conditional loop, the renormalization module 102 implements a simple set of instructions to update L based on die current value of L, and implements the set of instructions a predetermined number of times, as determined by the pre-computed S parameter. Updating and renormalization of R is moved to the encode-decision module 100. Furthermore, renormalization of L is moved to the encode-decision module 100.

Similarly, as the renormalization module 102 continues to run, any data that is not immediately needed by the PutBit module 104 is stored in the third FIFO buffer 110. The third FIFO buffer 110 stores data (e.g., output Bit value (B), Outstanding Bits (OB)) in the third FIFO 110 until needed by the PutBit module 104. Consequently, the renormalization module 102 may continue to run in parallel with the PutBit module 104, without stopping and waiting for the PutBit module 104 to request data.

Note that the CABAC encode-bin module 82 lacks feedback between the various modules 100, 102, 104, which might otherwise necessitate serial or nested processing, which could slow down the operation of the CABAC encode-bin module 82. For the purposes of the present discussion, a first process is said to be nested within a second process if the second process must wait for the completion of the first process before the second process can be continue. Hence, a nested process, loop, or function, or other set of instructions may be any group of processes wherein one process requires results from another before proceeding with processing operations. The CABAC encode-bin module 82 is adapted to produce an output bitstream that substantially similar to what a conventional CABAC encode-bin module would produce, but does so more efficiently, via parallel processes instead of nested processes.

The example CABAC encode-bin module 82 is H.264 compliant. For the purposes of the present discussion, a module, processor, function, or other device or method is said to be H.264 compliant if any outputs thereof may be employed in an H.264 system. An H.264 system may be any set of components constructed in accordance with one or more H.264 standards.

The encode decision module 100 implements an encode-decision function. For the purposes of the present discussion, an encode decision function may be any operation that returns a result pertaining to a state associated with arithmetic coding process. An arithmetic coding process may be any process adapted to encode data into a number. An example encode-decision module determines or updates a context state pertaining an input to the module.

Hence, use of this embodiment may facilitate processing video frames in a single slice, which may greatly increase video quality. This is unlike certain conventional video processing systems that must partition each video frame into multiple slices due to use of relatively inefficient methods, serial processing, and hardware speed and performance, limitations.

The embodiment as shown in FIG. 4 has split the circular dependency between the encode-decision module 100 and the renormalization module 102 that occurs in conventional CABAC encoders as defined in H.264 standards. The elimination of the circular dependency facilitates enabling parallel executions of the new encode-decision module 100 and the PutBit module 104.

In summary, certain key modifications were made to a conventional H.264 CABAC encode-bin module to implement the CABAC encode-bin module 82, including:
 1. Logic employed to update L and R was moved from the renormalization module into the encode-decision module to remove the dependency of the encode decision on L and R values from the renormalization module, thereby effectively splitting the updating of L and R from output bitstream generation.

2. Single-cycle updating of R was implemented in the encode-decision module 100. Conventionally, the updating of R required a loop inside of a renormalization module, which included performing a left shift of R until all leading zero bits in R a shifted out. In the present embodiment, a loop count (S parameter) representing the number of leading zero bits in R was implemented in the encode-decision module 100. Relatively inexpensive and high-speed hardware may be employed to count leading zero bits to determine S, as implemented in the pre-computation circuit 127.

3. The encode-decision module 100 employs single-cycle updating of L, which conventionally required a loop inside the renormalization module. Knowledge of the loop count (S parameter) facilitates updating L via a single step or cycle, as illustrated via pseudo code discussed below. A simple conditional subtraction is employed to update L, where the amount to be subtracted from L is represented by the values in a mask-Lookup table. S may be employed to look up the values.

4. FIFO buffers 108, 110 were inserted to hold output data from the encode-decision module 100 and the renormalization module 102. This facilitates parallel executions of the encode-decision, renormalization, and PutBit functions, which are also facilitated by the removal of nested function calls, which further enables the renormalization module 102 and the PutBit module 104 to perform requisite processes or loops without stalling previous processes.

FIG. 5 is a diagram illustrating example inputs and outputs of an encode-decision module 100 of the encode-bin module 82 of FIG. 4. The encode-decision module 100 receives context index (CtxIdx), bin (Bin), bypass (ByPass), and End Of Sequence (EOS) inputs and provides an S (S), L-renomialization (Lrenorm), flush, and data_valid outputs. Lrenorm acts as a variable for storing the value of L. The meanings of the remaining variables should be clear with reference to the pseudo-code below and/or H.264 standards.

In the present example embodiment, CtxIdx is a nine-bit input, while Bin, Bypass, and EOS are single-bit inputs, S is a four-bit output, Lrenorm is a sixteen-bit output, and flush and data_valid are single-bit outputs. Note, however, that other bit lengths for various inputs and outputs may be changed without departing from the scope of the present teachings.

An example set of instructions implemented by the encode-decision module 100 is provided below in pseudo code, where certain syntax, such as left-shift and right-shift operators (e.g., <<and>>) used in the pseudo code below, is similar to that used in the American National Standards Institute (ANSI) C programming language.

Encode decision:

```
{
1. if(ByPass == 1) // encode bypass (equalprob)
    {
        1. L = L << 1;
        2. if(Bin == 1)
                L += R;
        3. output(S=1, Lrenorm=(L>>1), flush=0);
            if(L >= 0x400)
                L -= 0x400;
            else if (L < 0x200)
                L = L;
            else
                L -= 0x200;
            R = R;
    }
    else            // encode normal bin
    {
        /*load context state. To achieve 1 cycle/bin, context state
    can be loaded ahead of time. To handle write/read coherency, most
    recently updated context states are cached. When the input CtxId
    matches a cached context, the cached values are used instead. The
    exact number of cached context states required is application
    specific. */
        1. CtxState[5..0] = CtxStateLoad(CtxIdx);
           CtxMPS        = CtxMPSLoad(CtxIdx);
    // Context probability update and most probable bit
    comparison
        2. if(Bin == MPS)
                bLPS = 0;
           else
                bLPS = 1;
        3. if (CtxState == 0 and bLPS ==1)
                CtxMPS = not(CtxMPS);
           else
                CtxMPS = CtxMPS;
           if(bLPS == 1)
                CtxState = LPSStateLookup ( CtxState[5..0]);
           else if (CtxState < 62)
                CtxState = CtxState + 1;
           else
                CtxState = CtxState;
        4. Store CtxState and CtxMPS;
    // Renormalize R, L
        2. R_LPS[7..0] = RLPSLookup( CtxState[5..0], R[8..7] );
    //256 entries of 8-bit
        3. R2[8..0] = R[8..0] – R_LPS[7..0];
        4. L2[15..0] = L[15..0] + R2[8..0];
        5. if (bLPS == 1)
                R3[8..0] = R_LPS;
                L3[15..0] = L2;
           else
                R3[8..0] = R2;
                L3[15..0] = L;
        6. Shift[3..0] = CountNumLeadingZeroBit( R3[8..0] );
        7. Output(Lrenorm=L3, S=Shift, flush=EOS);
            R = R3 << Shift;
            L4[17..0] = L3[15..0] << Shift;
            mask = maskLookup( Shift );
        8. if (L4 < mask)
                L[15..0] = L4[8..0]      // keep only 9 LSB
           else
                L[15..0] = L4 – mask;    // only 8-bit MSB subtract
    }
}
```

Note that the above pseudo-code for the encode-bin module 100 includes renormalization of L and R and the computation of S. S is a four-bit number representing the number of leading zero bits in the R3 register or array indicated in the pseudo code above.

The renormalization of L and R and the computation of S occur in the pre-computation module 127 of FIG. 4. Furthermore, note that the encode-decision process indicated by the pseudo code above employs an L and R registers or arrays 114 of Fi and a context state register or array 118, as shown in FIG. 4, to facilitate calculations.

FIG. 6 is a diagram illustrating example inputs and outputs of the renormalization module 102 of the encode-bin module 82 of FIG. 4. The renormalization module 102 receives S, L-renormalization (Lrenom), flush (flush), and QB inputs from the second FIFO 108 and OB register 122 of FIG. 4 and outputs bit value (B), a first Outstanding Bits (OB) value, a second OB value (OB2), a bit-flush value (Bflush), and a data-ready value (data_ready).

An example set of instructions implemented by the renormalization module 102 is provided below in pseudo code, where certain syntax may be understood with reference to syntax defined by ANSI for the C programming language.

Renormalization:

```
{
    L = Lrenorm;
    1.for S times
        {
            1. if (L < 0x100)
                {
                    1. Output(B=0; OB2=OB, BFlush=0);
                        L = L;
                    2. OB = 0;
                }
                else
                {
                    if (L >= 0x200)
                    {
                        1. Output(B=1, OB2=OB, BFlush=0);
                            L = L - 0x200;
                        2. OB = 0;
                    }
                    else
                    {
                        1. L = L - 0x100;
                            OB = OB + 1;
                    }
                }
            // shift L left by 1 every cycle
            2. L = L << 1;
        }
    // flush bits at end of slice
    2. if (bFlush == 1)
        {
            1. Output(B=L[10], OB2=OB, BFlush=0;
                OB = 0;
            2. Output(B=L[9], OB2=0, BFlush=1);
        }
}
```

Note that the above pseudo-code for the renormalization module 102 of FIG. 4 repeats the first step (step 1) S times. Hence, S acts as a pre-computed counter that tells the renormalization module 102 of FIG. 4 how many iterations to perform on a given set of inputs.

With reference to FIGS. 4, 5, and 6, the encode-decision module 100 of FIGS. 4 and 5 sends the S parameter to the renormalization module 102 along with other inputs as needed. The renormalization module 102 refrains from taking new data from the encode-decision module 100 until S cycles have been completed. Simultaneously, the encode-decision module 100 continues to run without needing to wait for the renormalization module 102 to complete processing of a given set of inputs.

Note that the renormalization module 102 and the encode-decision module 100 may represent processes running at different speeds. The second FIFO 108 selectively holds data from the encode-decision module 100 as needed, while the renormalization module 102 is completing S cycles based on its input.

Figure 7:
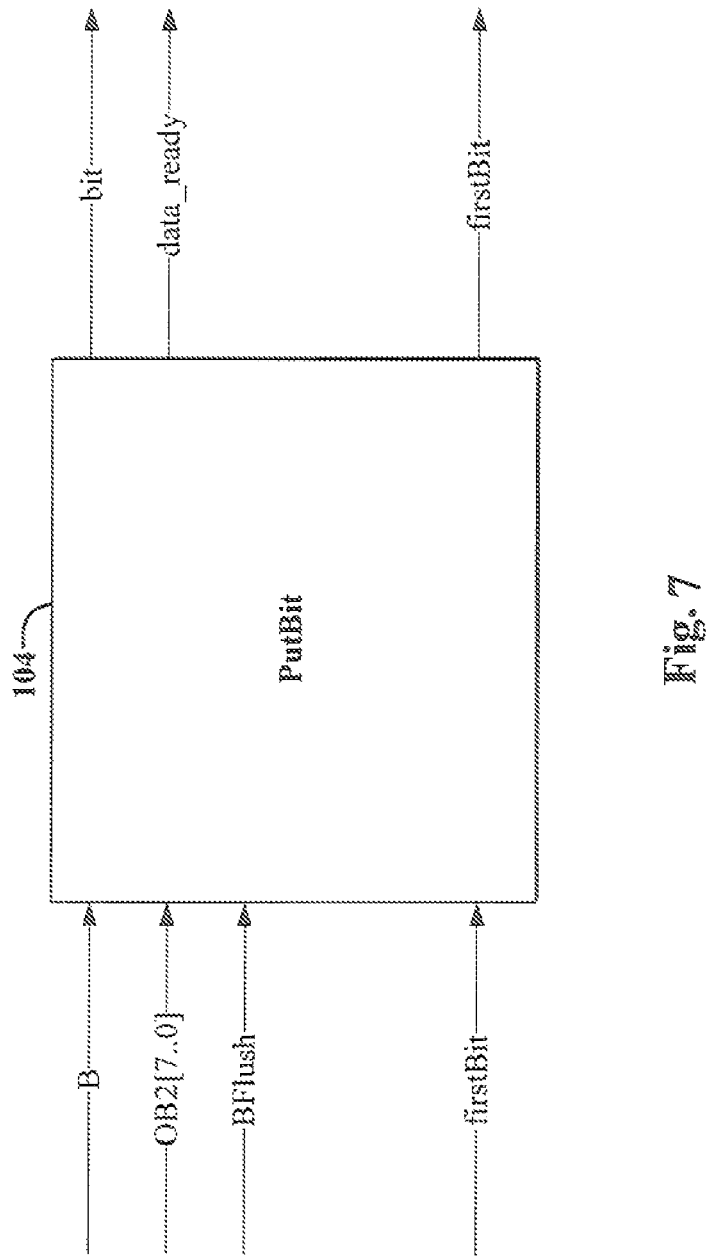
FIG. 7 is a diagram illustrating example inputs and outputs of a PutBit module of the encode-bin module of FIG. 4.

FIG. 7 is a diagram illustrating example inputs and outputs of a PutBit module 104 of the encode-bin module 82 of FIG. 4. With reference to FIGS. 4, 6, and 7, the PutBit module 104 receives B, OB2, Bflush, and first-bit (firstBit) inputs from the third FIFO 110 and first-bit register 124 of FIG. 4, and provides bitstream (bit), data-ready (data_ready), and firstBit outputs. The bitstream (bit) output from the PutBit module 104 represents the output of the encode-bin module 82.

An example set of instructions implemented by the PutBit module 104 is provided below in pseudo code, where certain syntax may be understood with, reference to syntax defined by ANSI for the C programming language.

PutBit:

```
Internal Register: bFirstBit
if (BFlush)          // end of slice flush bits
{
    Output(bit=B);
    Output(bit=1);
    Output bits to byte-align buffer;
}
else                 // encode normal bin
{
    if (firstBit == 1)
    {
        firstBit = 0;
    }
    else
    {
        OutputBit(bit=B);
    }
    for OB2 times
    {
        OutputBit(bit=!B);
    }
}
```

Note, with reference to the above pseudo code for PutBit, that OB2 is employed to determine how many times to output the compliment of B in an output sequence. The function OntpntBit(x) is a function that outputs bits associated with x from the PutBit module 104.

Note that if the Bflush parameter is set, flush bits at the end of a video slice have been reached, and an encode-terminate function is implemented. The encode-terminate function involves outputting B (bit=B) followed by a one (1) and then performing byte-alignment of one or more buffers as needed. Clever use of the Bflush parameter obviates the need to implement encode-terminate as a separate function outside of the PutBit module 104.

Figure 8:
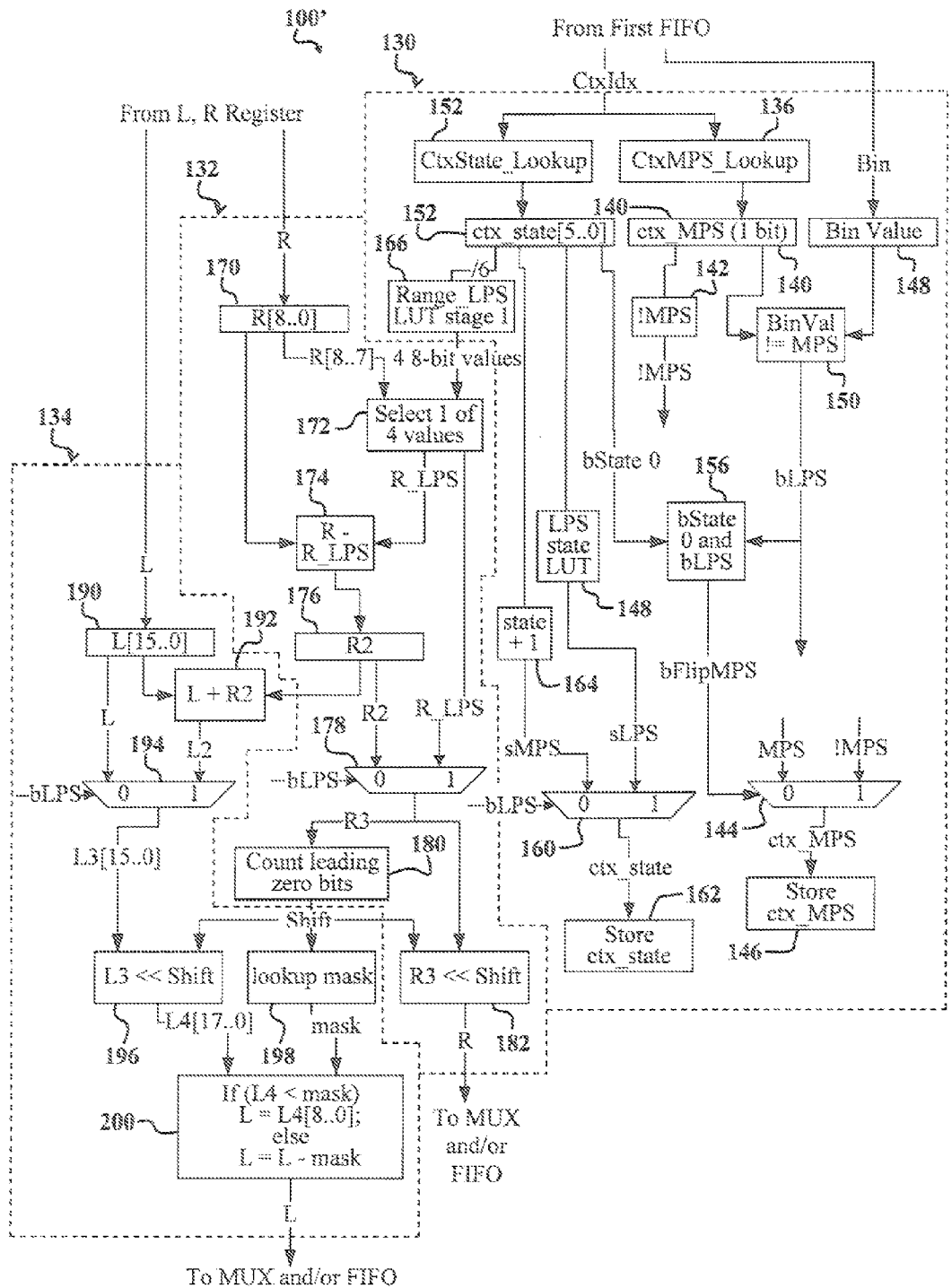
FIG. 8 is a flow diagram of an example process implemented by the encode-decision module of FIG. 5 via parallel processing.

FIG. 8 is a flow diagram of an example process 100' implemented by the encode-decision module of FIG. 5 via parallel processing. The encode-decision process 100' represents a 3-stage pipeline, wherein three different stages 130, 132, 134 are performed in parallel in a pipelined fashion.

The first stage 130 includes a context-state lookup function (CtxState_lookup) 138 and a context-state MPS lookup function (ctxMPS_Lookup) 136, which receive context index (CtxIdx) as input and provide context-state (ctx_state) 152 and context-MPS (ctx_MPS) 140, respectively, as output. The logical compliment of the context-MPS-value is computed by an MPS-compliment module 142 and subsequently output to one terminal of a context-MPS MUX 144. The context-MPS value input to another terminal of the context-MPS MUX 144.

A bin-value decision module 150 employs the context-MPS value 140 and a bin value 148 to perform a bio-decision function 150 to determine an LPS associated with the bin (bLPS). The bin-decision function 150 provides a bLPS signal to a context-state MUX 160 in the first stage 130; to an R MUX 178 in the second stage 132; and to an L MUX 194 in the third stage 134. bLPS is also provided to a b-state function 156, which outputs a MUX control signal (bFlipMPS) based on whether the state associated with the bin (b) is equal to zero and based on bLPS.

The context-state value 152 is also provided to an LPS Lookup Table (LUT), which outputs a state associated with an LPS (sLPS) to an input terminal of the context-state MUX 160. The context-state value 152 is incremented by one by a state-incrementing function 164 to yield a state value associated with an MPS (sMPS). sMPS is then input to a second input terminal of the context-state MUX 160. An updated context-state value is output from the context-state MUX 160 and stored in a context-state memory 162. The updated context-state value is affected by bPLS, which acts as a control input to the context-state MUX 160. Similarly, an updated context-MPS value is selectively output from the context-MPS MUX 144 to a context-MPS memory 146.

In the present example embodiment, the lookup functions 136, 138 of the encode-decision process 100' are configured to preload a recently used context value, such as ctx_state and ctx_MPS, to facilitate implementing a context function via a one-cycle process. For the purposes of the present discussion, a one-cycle process; may be any process that may be implemented so that only one clock cycle or iteration of a function is required to produce a desired output. The encode-decision process 100' and associated lookup functions may be readily implemented by those skilled in the art with access to the present teachings without undue experimentation.

Various modules or functions 140-166 in the first stage 130 depend on the current context state. Consequently, the first stage 130 is said to have context dependency.

The second stage 132 includes a range-selection function 172, which receives four different range LPS (Range_LPS) values from, a range-LPS LUT 166, The range-selection function 172 further receives R 170 associated with the current bin and provides a selected R LPS (R_LPS) value as output. R_LPS is input to a first terminal of the R MUX 178 and to a range subtracter function 174. The range subtract 174 subtracts R_LPS from R, which results in. R2 176, which is input to a second terminal of the R MUX 178, The bLPS value output from the bin-decision function 150 acts as a control input to the R MUX 178.

Output of the R MUX 178 is an R value, called R3, the bits of which are selectively left shifted by an R-shifter function 182. R3 is also input to a leading zero-counter function 180, which counts leading zeros of R3 to determine a four-bit S parameter (Shift). In this case, Shift acts as a control input to the R-shifter function 182, which affects how much R3 is shifted, to yield the renormalized R value, which represents the output of the second stage 132.

The second stage 132 depends on values of R for the current bin. Consequently, the second stage 132 is said to have R-dependency.

The third stage 134 receives L 190 as input, which is provided to an adder function 192. The adder function 192 adds L and R2 to yield L2. L2 is input to a first terminal of the L MUX 194. L is input to a second terminal of the L MUX 194. The L MUX 194 outputs L3, which equals L or L2 depending upon the value of the bLPS control input to the L MUX 194. L3 is then selectively shifted, via an L-shifter function 196. The L-shifter function 196 left shifts L3 by Shift amount, which yields L4. A lookup mask 198 is determined based on Shift, and the resulting mask value is input to an L-determining function 200. The L-determining function 200 sets the renormalized output interval offset value (L) to equal L4 if L4 is less than the mask value. Otherwise, L is set equal to the difference between L4 and the current value of mask (L4-mask). The resulting L value represents the output of the third stage 134.

The third stage 134 depends on values off for the current bin. Consequently, the third stage 134 is said to have R dependency.

The process flow 100' clearly shows that the three stages 130, 132, and 134 have limited interdependencies, enabling the three stages 130, 132, 134 to be readily implemented via a pipelined processor, parallel engines, or in software.

Conventionally, production of the L, R, ctx_state and ctx_MPS values output by the encode-decision process 100' requires nested loops and serial processing. By organizing the logic of an encode-decision process in the manner shown in FIG. 4, great improvements in CABAC encoder speed and performance are achievable.

An alternative description of the encode-decision process 100' is provided in the pseudo code above pertaining to the encode-decision module 100 of FIG. 5.

Figure 9:
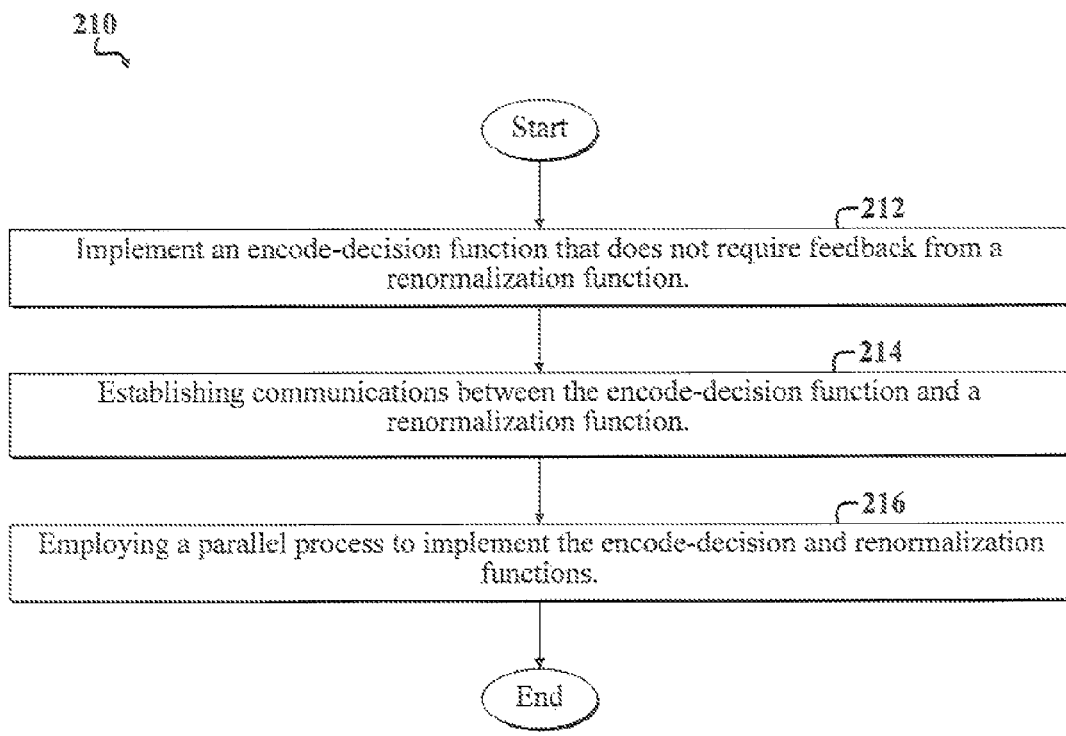
FIG. 9 is a flow diagram of a method suitable for use with the CABAC module and accompanying components of FIGS. 3-7.

FIG. 9 is a flow diagram of a method 210 suitable for use with the CABAC module 34 and accompanying components of FIGS. 3-7. The method 210 includes a first step 212 that involves implementing an encode-decision function. A second step 214 includes establishing communications between the encode-decision function and a renormalization function. A third step 216 includes employing a parallel process to implement the encode-decision and renormalization functions.

With reference to FIGS. 2-9, use of parallel processing in accordance with various embodiments disclosed herein may improve the performance of not only the CABAC 34 but also the accompanying encoder 20. For example, the rate-control module 52 of FIG. 2 will receive output data from the CABAC module 34 more quickly, thereby enabling the rate-control module 52 to more effectively control the behavior of the quantizer 38. Hence, use of faster parallel processing operations within the CABAC 34 may reduce CABAC feedback latency, thereby further enhancing encoder output quality.

Although embodiments of the invention are discussed primarily with respect to an H.264-compliant encoder, embodiments of the present invention may be adapted to any video encoder wherein parallel engines or a pipelined engine may be useful. Furthermore, any acceptable architecture, topology, protocols, or other network and digital processing features can be employed. In general, certain modules and components discussed herein can be implemented in hardware, software, or via any device with processing ability or other requisite functionality. Techniques described herein may be suitable for use with other types of information processing. For example, the processing can operate on previously compressed or encoded image information, on three-dimensional image data, on non-visual information, etc.

Although specific processing sequences have been provided for processing data such as macroblocks, sub-blocks, slices, etc., any other suitable processing order or approach may be used. For example, any number of contiguous macroblocks may be in a slice. A slice can be a horizontal band but can also span horizontal bands, or be oriented vertically, diagonally, or in other non-horizontal directions.

Although specific processing sequences have been provided for processing data such as macroblocks, sub-blocks, slices, etc., any other suitable processing order or approach may be used. For example, any number of contiguous macroblocks may be in a slice. A slice can be a horizontal band but can also span horizontal bands, or be oriented vertically, diagonally, or in other non-horizontal directions.

Arrowheads shown on signal paths between various modules are for illustrative purposes only. For example, various communication paths or connecting lines, which appear to be unidirectional in the drawings, may be bidirectional without departing from the scope of the present invention.

Although processes of the present invention and the hardware executing the processes may be characterized by language common to a discussion of video processing (e.g., "FPGA," "CABAC," etc.), it should be apparent that operations of an embodiment of the present invention can execute on any type of suitable hardware in any communication relationship to another device on any type of link or network.

Although a process of the present invention may be presented as a single entity, such as software or hardware executing on a single machine, such software can readily be executed ors multiple machines. That is, there may be multiple instances of a given software program, a single program may be executing on two or more processors in a distributed, processing environment, parts of a single program may be executing on different physical machines, etc. Furthermore, two different programs, such as a transformation program and a quantization program, can be executing in a single module, or in different modules.

Although the invention has been discussed with respect to specific example embodiments thereof, these embodiments are merely illustrative, and not restrictive, of the invention. In the description herein, numerous specific details are provided, such, as examples of components and/or methods, to provide a thorough understanding of discussed example embodiments. One skilled in the relevant art will recognize, however, that certain embodiments can be practiced without one or more of the specific details, or with other apparatus, systems, assemblies, methods, components, materials, parts, and/or the like. In other instances, well-known structures, materials, or operations are not specifically shown or described in detail to avoid obscuring aspects of the example embodiments discussed herein.

A "machine-readable medium" or "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems. A computer may be any processor in communication with a memory.

Reference throughout this specification to "one embodiment", "an example embodiment", or "a specific embodiment" means that a particular feature, structure, or characteristic described in connection with the embodiment not necessarily included in all possible example embodiments. Thus, respective appearances of the phrases "in one embodiment", "in an embodiment", or "in a specific embodiment" in various places throughout this specification are not necessarily referring to the same embodiment Furthermore, the particular features, structures, or characteristics of any specific embodiment, or example embodiment discussed herein may be combined in any suitable manner with one or more other embodiments, it is to be understood that other variations and modifications of the embodiments described and illustrated herein are possible in light of the teachings herein, and the variations are to be considered as part of the spirit and scope of the present invention.

Example embodiments discussed herein may be implemented in whole or in part by using a programmed general purpose digital computer; by using application, specific integrated, circuits, programmable logic devices, FPGAs, optical, chemical, biological, quantum or nanoengineered systems or mechanisms; and so on. In general, the functions of various embodiments can be achieved by any means as is known in the art. Distributed or networked systems, components, and/or circuits can be used. Communication, or transfer of data, may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program, or code that can be stored in a machine-readable medium to permit a computer to perform any of the methods described above.

Additionally, any signal arrows in the drawings/figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow "a", "an", and "the" include plural references unless the context clearly dictates otherwise. Furthermore, as used in the description herein and throughout the claims that follow, the meaning of "in" includes "in" and "on" unless the context clearly dictates otherwise.

The foregoing description of illustrated example embodiments, including what is described in the Abstract, is not intended to be exhaustive or to limit the invention to the precise forms disclosed herein. While certain example embodiments are described herein for illustrative purposes only, various equivalent modifications are possible within the spirit and scope of the present invention, as those skilled in the relevant art will recognize and appreciate. As indicated, these modifications may be made in light of the foregoing description of illustrated example embodiments and are to be included within the spirit and scope of the present invention.

Thus, while example embodiments have been described herein, a latitude of modification, various changes and substitutions are intended in the foregoing disclosures, and it will be appreciated that in some instances some features of embodiments will be employed without a corresponding use of oilier features without departing from, the scope and spirit of the invention. Therefore, many modifications may be made to adapt a particular situation or material to the essential scope and spirit of the present invention. It is intended that the invention not be limited to the particular terms used in following claims and/or to a particular embodiment disclosed as the best mode contemplated for carrying out this invention, but that the invention will include any and all embodiments and equivalents falling within the scope of the appended claims.

What is claimed is:

1. An apparatus comprising:
a memory; and
a processor operative to execute:
a renormalization process module adapted to determine output bit based on an interval range and a loop parameter, wherein the loop parameter represents a number of leading zero bits in the interval range, and
an encode-decision process module in communication with the renormalization process module, wherein the encode-decision process is adapted to run in parallel with the renormalization process, wherein the encode decision process module is adapted to update the interval range of an interval and a beginning position of the interval in a code based on the loop parameter.

2. The apparatus of claim 1, wherein the renormalization processes is not nested within the encode-decision process.

3. The apparatus of claim 2, wherein the encode-decision process module includes: a first software module operative to pre-compute the interval range and a beginning position of the interval and the loop parameter to eliminate nesting of the renormalization process within the encode-decision process.

4. The apparatus of claim 3, wherein the renormalization process and the encode-decision process are components of a Context Adaptive Binary Arithmetic Code (CABAC) module.

5. The apparatus of claim 1, wherein the entropy coding software module is H.264 compliant.

6. The apparatus of claim 1, wherein the processor operative to further execute a pulse code modulation module, wherein the pulse code modulation module is adapted to prepare received macroblock pixels for transmission instead of performing entropy coding.

7. The apparatus of claim 6, wherein the Bit instruct a PutBit module to insert either zero or one into a bitstream.

8. The apparatus of claim 1, wherein the determined output bit comprises a Bit and an Outstanding Bit.

9. The apparatus of claim 1, wherein the loop parameter determines number of cycles the renormalization process module should run before receiving additional information from the encode decision module.

10. A pipeline processor operative to implement an entropy coding module comprising:
an encode-decision process module adapted to implement an encode-decision function for a Context Adaptive Binary Arithmetic Coding (CABAC) module, wherein the encode decision function comprises updating an interval range and a beginning position of an interval in a code based on a loop parameter, wherein the loop parameter represents a number of leading zero bits in the interval range.

11. The module of claim 10, wherein the pipelined processor includes: first means for implementing one or more nested loops specified in H.264 standards for an encode-decision process via a process lacking the one or more nested loops.

12. The module of claim 11, wherein the first means includes: second means for computing certain parameters in another function or location than within a loop nested within the encode-decision processes.

13. The module of claim 11, wherein the process includes: a parallel process.

14. The module of claim 11, wherein the first means includes at least three stages of a single-cycle pipeline.

15. The module of claim 10, wherein the encode-decision module includes: a look-up function adapted to preload a recently used context value to facilitate implementing a context function via a one-cycle process.

16. The module of claim 15, wherein the context value includes: a context state and a context Most Probable Bit (MPB) value.

17. An apparatus comprising:
a memory; and
a processor operative to execute:
an entropy coding software module comprising a renormalization module; and
an encode-decision software module in communication with the renormalization module and lacking sufficient dependency on output from the renormalization module to enable the encode-decision module to run in parallel with the renormalization module, wherein the encode decision software module is adapted to update an interval range and a beginning position of an interval in a code based on a loop parameter, wherein the loop parameter represents a number of leading zero bits in the interval range.

18. The apparatus of claim 17, further including: a predetermined parameter adapted to facilitate eliminating a dependency between the encode-decision module and the renormalization module, the predetermined parameter comprising at least one of the statistic value and the probability value.

19. The apparatus of claim 18, wherein the predetermined parameter includes: a value affecting a duration of processing implemented by the renormalization module.

20. The apparatus of claim 18, further including: a buffer positioned between the renormalization module and the encode-decision module, wherein the buffer is adapted to hold information to facilitate enabling the renormalization module to run in parallel with the encode-decision module.

21. The apparatus of claim 17, further including: a PutBit module coupled to the renormalization module and adapted to run in parallel with the renormalization module and the encode-decision module.

22. An entropy-coding apparatus comprising:
a memory;
a processor connected to the memory and operative to:
an encode-decision software module;
a renormalization module coupled to the encode-decision software module; and
first means for enabling the encode-decision module to operate independent of feedback from the renormalization module, wherein the first mean is adapted to determine a loop parameter (S) representing a number of leading zero bits in an interval range.

23. The apparatus of claim 22, further including: a PutBit module coupled to an output of the renormalization module.

24. The apparatus of claim 22, further including: a first pipelined processor adapted to implement the encode-decision module and the renormalization module in parallel.

25. The apparatus of claim 24, wherein the encode-decision includes: a parallel process.

26. The apparatus of claim 25, wherein the parallel process includes: means for computing an interval offset value (L) and an interval range value (R).

27. The apparatus of claim 26, wherein the renormalization module includes: one or more instructions for employing L and R to determine a value of an output bit (B).

28. The apparatus of claim 27, wherein the renormalization module includes: one or more instructions for employing L and R to determine a first Outstanding Bit (OB) value and a second Outstanding Bit (OB2) value.

29. The apparatus of claim 25, wherein the encode-decision module further includes: one or more instructions for determining a context state; determining an interval offset value (L); and determining an interval range value (R) via the parallel process.

* * * * *